US008797113B2

(12) United States Patent
Yamanouchi

(10) Patent No.: US 8,797,113 B2
(45) Date of Patent: Aug. 5, 2014

(54) POWER AMPLIFIER, WIRELESS COMMUNICATION DEVICE, AND POWER AMPLIFICATION METHOD

(75) Inventor: Shingo Yamanouchi, Tokyo (JP)

(73) Assignee: NEC Corporation, Tokyo (JP)

( * ) Notice: Subject to any disclaimer, the term of this patent is extended or adjusted under 35 U.S.C. 154(b) by 162 days.

(21) Appl. No.: 13/499,205

(22) PCT Filed: Sep. 30, 2010

(86) PCT No.: PCT/JP2010/067037
§ 371 (c)(1),
(2), (4) Date: Mar. 29, 2012

(87) PCT Pub. No.: WO2011/040507
PCT Pub. Date: Jul. 4, 2011

(65) Prior Publication Data
US 2012/0188024 A1 Jul. 26, 2012

(30) Foreign Application Priority Data

Sep. 30, 2009 (JP) ................................. 2009-227989

(51) Int. Cl.
*H03C 5/00* (2006.01)
*H03G 3/00* (2006.01)
*H03F 3/217* (2006.01)

(52) U.S. Cl.
CPC ................. *H03C 5/00* (2013.01); *H03G 3/001* (2013.01); *H03G 3/004* (2013.01); *H03F 3/2171* (2013.01)
USPC ........... 332/151; 332/149; 332/176; 330/136; 330/124 R; 330/297; 330/10; 455/127.1

(58) Field of Classification Search
USPC .................... 330/136, 124 R, 124 D, 297, 10; 332/149, 151, 152, 176; 375/297; 455/127.1
See application file for complete search history.

(56) References Cited

U.S. PATENT DOCUMENTS

| 5,905,407 A | 5/1999 | Midya |
| 6,300,826 B1 | 10/2001 | Mathe et al. |

(Continued)

FOREIGN PATENT DOCUMENTS

| JP | 2002-252524 A | 9/2002 |
| JP | 2003-533116 A | 11/2003 |

(Continued)

OTHER PUBLICATIONS

International Search Report of PCT/JP2010/067037 dated Dec. 21, 2010.

*Primary Examiner* — Ryan Johnson
(74) *Attorney, Agent, or Firm* — Sughrue Mion, PLLC

(57) ABSTRACT

A power amplifier comprises: polar modulator that receives modulated signal including amplitude-modulated component and phase-modulated component, outputs the amplitude-modulated component, superimposes the modulated signal on carrier wave to generate signal output as RF-modulated signal, and delays at least one of the amplitude-modulated component and the RF-modulated signal; first amplitude modulator that receives the amplitude-modulated component, pulse-modulates the amplitude-modulated component to generate signal output as pulse-modulated signal, and amplifies the amplitude-modulated component with the amplitude-modulated component and the pulse-modulated signal as control signals; second amplitude modulator that receives the amplitude-modulated component and the pulse-modulated signal, and amplifies the amplitude-modulated component with the amplitude-modulated component and the pulse-modulated signal as control signals; and first RF amplifier that receives the RF-modulated signal, amplifies the RF-modulated signal, and amplitude-modulates the amplified RF-modulated signal with output signal of second amplitude modulator.

18 Claims, 13 Drawing Sheets

(56) References Cited

U.S. PATENT DOCUMENTS

| | | |
|---|---|---|
| 6,583,664 B2 | 6/2003 | Mathe et al. |
| 6,937,720 B2 | 8/2005 | Casier et al. |
| 7,855,599 B2 | 12/2010 | Yamanouchi |
| 8,030,995 B2 * | 10/2011 | Okubo et al. ............... 330/127 |
| 2002/0008574 A1 | 1/2002 | Mathe et al. |
| 2002/0084811 A1 | 7/2002 | Casier et al. |
| 2010/0109769 A1 | 5/2010 | Yamanouchi |

FOREIGN PATENT DOCUMENTS

| | | |
|---|---|---|
| WO | 2008/090712 A1 | 7/2008 |
| WO | 2009/101905 A1 | 8/2009 |

* cited by examiner

US 8,797,113 B2

POWER AMPLIFIER, WIRELESS COMMUNICATION DEVICE, AND POWER AMPLIFICATION METHOD

CROSS REFERENCE TO RELATED APPLICATIONS

This application is a National Stage of International Application No. PCT/JP2010/067037 filed Sep. 30, 2010, claiming priority based on Japanese Patent Application No. 2009-227989 filed Sep. 30, 2009, the contents of all of which are incorporated herein by reference in their entirety.

TECHNICAL FIELD

1. Description of Related Application

This application claims the benefit of Japanese Patent Application No. 2009-227989, filed on Sep. 30, 2009, which is hereby incorporated by reference herein in its entirety. The present invention relates to a power amplifier, a wireless communication device, and a power amplification method, and in particular to a power amplifier used in wireless communication and required to have high power efficiency, a wireless communication device provided with the power amplifier, and a power amplification method.

2. Background

In a wireless communication device, a power amplifier (PA) for a transmitter, which is used therein, in particular consumes a lot of power. Therefore there is a need to improve the power efficiency of PAs in the development of wireless communication devices. In communication standards in recent years, amplitude modulation has become an important trend in improving spectral efficiency. Since demands with regard to signal distortion in amplitude modulation are strict, the power amplifier is operated in a high back-off (low input power) state that has good linearity. However, when a high back-off operation is performed, there is a problem in that the power efficiency of power amplification is reduced.

In order to realize both high power efficiency and good linearity in PAs, polar modulation technology is being widely studied in recent years. FIG. 9 is a diagram showing a configuration of a power amplifier in which Envelope Tracking (ET) technology is applied.

Referring to FIG. 9, in an ET system, which is one type of polar modulation technology, a polar modulator 411 receives transmission signal data from an input terminal 401, outputs an amplitude-modulated component 403 of the transmission signal to an output terminal 402, and outputs an RF (Radio Frequency, high-frequency wave) modulated signal 408, with an amplitude component and a phase component of the transmission signal data on a carrier wave, to an output terminal 407. The polar modulator 411 can set output timing of the amplitude-modulated component 403 and the RF-modulated signal 408 separately to desired values.

An amplitude modulator 404 outputs an amplitude-modulated component 405 amplifying the amplitude-modulated component 403, and performs modulation with respect to a voltage source terminal 409 of an RF amplifier (RF-PA: Radio Frequency Power Amplifier) 406 according to the amplitude-modulated component 405. The RF-PA 406 receives the RF-modulated signal 408 outputted to the output terminal 407. The RF-PA 406 amplifies a carrier wave carrying an amplitude component and a phase component of the transmission signal data, and outputs an RF-modulated signal 410 obtained, to an output terminal 412.

In the abovementioned ET technology, voltage of the voltage source terminal 409 of the RF-PA 406 is controlled to match amplitude of the RF-modulated signal 410. In particular, in a case where the RF-modulated signal 410 has low output power, the voltage of the voltage source terminal 409 of the RF-PA 406 is reduced. Therefore, power supplied from the amplitude modulator 404, at a time of low output, to the RF-PA 406 is curtailed to the minimum required amount, and it is possible to curtail unnecessary power consumption.

An EER (Envelope Elimination and Restoration) system is cited as a technology that resembles the ET system. FIG. 10 is a diagram showing a configuration of a power amplifier in which EER technology is applied.

Referring to FIG. 10, in the EER system, the polar modulator 411 outputs an RF phase-modulated signal 413, with a phase component of the transmission signal carried on a carrier wave, to the output terminal 407, and the RF-PA 406 receives the phase-modulated signal 413. In this case also, it is possible to perform modulation with respect to the voltage source terminal 409 by the RF-PA 406, with the amplitude-modulated component 405, to reduce source voltage of the RF-PA 406 when the amplitude of the RF-modulated signal 410 is low, and to curtail unnecessary power consumption when output is low.

However, according to such polar modulation systems, while there is a demand for both wideband (high speed) and a wide dynamic range (high voltage, low noise), and high power efficiency, in the amplitude modulator 404, there is a problem in that it is difficult to satisfy these requirements with the abovementioned technology. For example, in a case of implementing the amplitude modulator 404 by a linear regulator, while it is possible to realize a wideband (high speed) characteristic and a wide dynamic range (low noise) characteristic, it is difficult to realize high power efficiency. On the other hand, in a case of implementing the amplitude modulator 404 by a switching regulator, while it is possible to realize high power efficiency, it is difficult to realize a wideband (high speed) characteristic and a wide dynamic range (low noise) characteristic. Furthermore, since there is a tendency for a transistor configuring the amplitude modulator 404 to have reduced operating speed with high voltage, in general it is difficult to realize both high voltage operation and the wideband (high speed) characteristic.

A method of solving the problems of the amplitude modulator of the abovementioned polar modulation systems is proposed in Patent Document 1. FIG. 11 is a configuration diagram of an invention described in Patent Document 1.

Referring to FIG. 11, an amplitude-modulated component 403 received by an output terminal 402 is amplified by a linear amplifier 209 and received by a linear amplifier 201, and a desired voltage 405 ($V_{out}$) is applied to a voltage source terminal 409 of an RF-PA 406 that is a load of the amplitude modulator 404, according to an output voltage $V_C$ of the linear amplifier 201. By having a voltage-follower type-configuration, the linear amplifier 201 operates as a low output impedance voltage source. Furthermore, a current $I_M$ is outputted from a switching amplifier 202 configured by an inverter circuit 203 and an inductor 204, and is supplied to the voltage source terminal 409 of the RF-PA 406. A hysteresis comparator 206 outputs a pulse-modulated signal 207 to a high-side gate driver 208a and a low-side gate driver 208b, based on a detection current $I_C$ in a sense resistor 205. The gate drivers 208a and 208b control output current of the switching amplifier 202 based on the pulse-modulated signal 207.

According to Patent Document 1, a current feedback loop 210 is configured so that the output current $I_C$ of the linear amplifier 201 is curtailed, and a current $I_{out}$ supplied to the voltage source terminal 409 of the RF-PA 406 and the output current $I_M$ of the switching amplifier 202 match. According to this configuration, an output voltage $V_{out}$ of the amplitude modulator 404 substantially matches the output voltage $V_C$ of the linear amplifier 201 that operates as a voltage source with no output error. Therefore, it is possible to suppress error of the output voltage $V_{out}$. Furthermore, a major part of the current $I_{out}$ (and power) supplied to the voltage source terminal 409 of the RF-PA 406 is supplied by the output current $I_M$ (and power) of the switching amplifier 202 that has high efficiency. Therefore, the power efficiency of the amplitude modulator 404 also has high efficiency. In this way, by using the switching amplifier 202 together with the linear amplifier 201 in Patent Document 1, high power efficiency and wide dynamic range (low noise) characteristics are both realized.

Patent Documents 2 and 3 describe circuits based on the same principle as Patent Document 1. Since the principles of these documents are similar to content already described, descriptions thereof is omitted.

Patent Document 1

U.S. Pat. No. 5,905,407

Patent Document 2

Japanese Patent Kokai Publication No. JP2002-252524A

Patent Document 3

Japanese Patent Kohyo Publication No. JP2003-533116A

SUMMARY

The entire disclosed contents of the abovementioned Patent Documents 1 to 3 are incorporated herein by reference thereto. The following analysis is given according to the present invention.

In the system of Patent Document 1 (FIG. 11), in a case where a switching amplifier 202 outputs high power of several dozen Watts (W) or more, gate drivers 208a and 208b are preferably implemented as discrete parts. However, such gate drivers 208a and 208b have a delay time of approximately several dozen nano-seconds (ns). As a result, there is a problem in that the range of a current feedback loop 210 is limited by the delay time of the gate drivers 208a and 208b, and a desired wideband (high speed) characteristic is not obtained.

FIG. 12 shows a result of simulating the relationship of an input sinusoidal frequency and an average switching frequency of a pulse-modulated signal 207, in a case where an output terminal 402 receives a sinusoidal wave, in a configuration (FIG. 11) of Patent Document 1. Referring to FIG. 12, the average switching frequency of the pulse-modulated signal 207 is reduced by the delay of the gate drivers 208a and 208b. When the switching frequency of the pulse-modulated signal 207 decreases, error in an output current $I_M$ of the switching amplifier 202 increases, and an output current $I_C$ of a linear amplifier 201 increases to compensate for the error difference of $I_M$.

FIG. 13 shows a result of simulating the relationship between the input sinusoidal frequency and output current of the linear amplifier 201. Referring to FIG. 13, the output current $I_C$ of the linear amplifier 201 increases according to the delay of the gate drivers 208a and 208b. The increase of the output current $I_C$ of the linear amplifier 201 increases power consumption of the linear amplifier 201, and as a result lowers the power efficiency of an amplitude modulator 404. In particular, as a received signal becomes a wideband signal, the increase in power consumption of the linear amplifier 201 according to the delay of the gate drivers 208a and 208b becomes pronounced.

Therefore, there is a need in the art to provide a power amplifier and power amplification method that amplify a wideband signal with high power efficiency.

According to a first aspect of the present invention, there is provided a power amplifier comprising:
a polar modulator that receives a modulated signal including an amplitude-modulated component and a phase-modulated component, outputs the amplitude-modulated component, superimposes the modulated signal on a carrier wave to generate a signal output as an RF-modulated signal, and delays at least one of the amplitude-modulated component and the RF-modulated signal;
a first amplitude modulator that receives the amplitude-modulated component, pulse-modulates the amplitude-modulated component to generate a signal output as a pulse-modulated signal, and amplifies the amplitude-modulated component with the amplitude-modulated component and the pulse-modulated signal as control signals;
a second amplitude modulator that receives the amplitude-modulated component and the pulse-modulated signal, and amplifies the amplitude-modulated component with the amplitude-modulated component and the pulse-modulated signal as control signals; and
a first RF amplifier that receives the RF-modulated signal, amplifies the RF-modulated signal, and amplitude-modulates the amplified RF-modulated signal with an output signal of the second amplitude modulator.

According to a second aspect of the present invention, there is provided a power amplifier comprising:
a polar modulator that receives a modulated signal including an amplitude-modulated component and a phase-modulated component, outputs the amplitude-modulated component, superimposes the phase-modulated component on a carrier wave to generate a signal output as an RF phase-modulated signal, and delays at least one of the amplitude-modulated component and the RF phase-modulated signal;
a first amplitude modulator that receives the amplitude-modulated component, pulse-modulates the amplitude-modulated component to generate a signal output as a pulse-modulated signal, and amplifies the amplitude-modulated component with the amplitude-modulated component and the pulse-modulated signal as control signals;
a second amplitude modulator that receives the amplitude-modulated component and the pulse-modulated signal, and amplifies the amplitude-modulated component with the amplitude-modulated component and the pulse-modulated signal as control signals; and
a first RF amplifier that receives the RF phase-modulated signal, amplifies the RF-modulated signal, and amplitude-modulates the amplified RF-modulated signal with an output signal of the second amplitude modulator.

According to a third aspect of the present invention, there is provided a power amplification method comprising:
extracting an amplitude-modulated component from a modulated signal including the amplitude-modulated component and a phase-modulated component, superimposing the modulated signal on a carrier wave to generate an RF-modulated signal, and delaying at least one of the amplitude-modulated component and the RF-modulated signal;
pulse-modulating the amplitude-modulated component to generate a pulse-modulated signal, and first amplifying the amplitude-modulated component with the amplitude-modulated component and the pulse-modulated signal as control signals;

second amplifying the amplitude-modulated component with the amplitude-modulated component and the pulse-modulated signal as control signals to generate an amplified amplitude-modulated component; and third amplifying the RF-modulated signal and amplitude-modulating the amplified RF-modulated signal with the amplified amplitude-modulated component.

According to a fourth aspect of the present invention, there is provided a power amplification method comprising:

extracting an amplitude-modulated component from a modulated signal including the amplitude-modulated component and a phase-modulated component, superimposing the phase-modulated component on a carrier wave to generate an RF phase-modulated signal, and delaying at least one of the amplitude-modulated component and the RF phase-modulated signal;

pulse-modulating the amplitude-modulated component to have a pulse-modulated signal, and first amplifying the amplitude-modulated component with the amplitude-modulated component and the pulse-modulated signal as control signals;

second amplifying the amplitude-modulated component with the amplitude-modulated component and the pulse-modulated signal as control signals to generate an amplified amplitude-modulated component; and third amplifying the RF phase-modulated signal and amplitude-modulating the amplified RF phase-modulated signal with the amplified amplitude-modulated component.

The present invention provides the following advantage, but not restricted thereto. According to the power amplifier and the power amplification method of the present invention, it is possible to amplify a wideband signal with high power efficiency.

PREFERRED MODES

Figure 1:
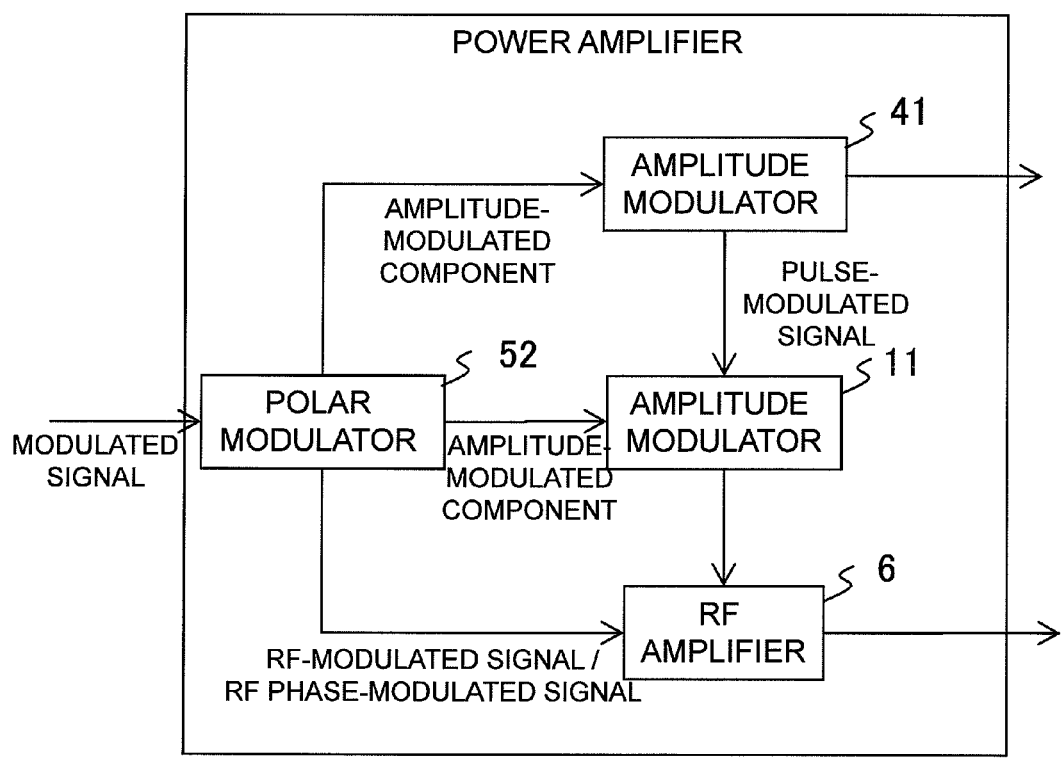
FIG. 1 is a block diagram showing a configuration of a power amplifier according to a first exemplary embodiment.

In the present disclosure, there are various possible modes, which include the following, but not restricted thereto. A power amplifier of a first developed mode may be a power amplifier according to the abovementioned first aspect.

The power amplifier of a second developed mode may be a power amplifier according to the abovementioned second aspect.

In the power amplifier of a third developed mode, the polar modulator may delay at least one of the amplitude-modulated component received by the first amplitude modulator and the amplitude-modulated component received by the second amplitude modulator.

The power amplifier of a fourth developed mode may further comprise a second RF amplifier that receives and amplifies the RF-modulated signal or the RF phase-modulated signal, and amplitude-modulates the amplified signal with an output signal of the first amplitude modulator.

The power amplifier of a fifth developed mode may further comprise a resistance element that terminates an output signal of the first amplitude modulator.

In the power amplifier of a sixth developed mode, the first amplitude modulator may comprise:

a terminal that receives the amplitude-modulated component;

a voltage source that outputs a voltage signal by amplifying the amplitude-modulated component;

a pulse modulator that pulse-modulates the amplitude-modulated component and outputs a result as a pulse-modulated signal;

a current source that amplifies the amplitude-modulated component with the pulse-modulated signal as a control signal to generate a signal output as a current signal;

a terminal that combines the voltage signal and the current signal and outputs the combined signal; and a terminal that outputs the pulse-modulated signal.

In the power amplifier of a seventh developed mode, the second amplitude modulator may comprise:

a terminal that receives the amplitude-modulated component;

a voltage source that amplifies the amplitude-modulated component of the modulated signal and outputs a voltage signal;

a terminal that receives the pulse-modulated signal;

a current source that amplifies the amplitude-modulated component with the pulse-modulated signal as a control signal to generate a signal output as a current signal; and a terminal that combines the voltage signal and the current signal and outputs the combined signal.

In the power amplifier of an eighth developed mode, the voltage source may comprise a feedback amplifier.

In the power amplifier of a ninth developed mode, the current source may be a switching amplifier that amplifies the pulse-modulated signal, and then generates the current signal by smoothing by a smoothing filter.

In the power amplifier of a tenth developed mode, the switching amplifier may comprise:

a first switching element;

a second switching element;

a ground terminal to which an end of the first switching element is connected;

a DC power source to which an end of the second switching element is connected; and a smoothing filter comprising an inductor device having an end connected to a first node to which another end of the first switching element and another end of the second switching element are connected.

And in the power amplifier of the tenth developed mode, using the pulse-modulated signal, conduction and nonconduction of a current from the ground terminal to the first node may be controlled and also conduction and nonconduction of a current from the DC power source to the first node may be controlled so as to amplify the pulse-modulated signal, and the amplified signal may be smoothed by the inductor device to generate the current signal.

In the power amplifier of an eleventh developed mode, the switching amplifier may comprise:

a transformer;

a DC power source connected to one end of a primary coil of the transformer;

a switching element connected to another end of the primary coil of the transformer;

a ground terminal connected to one end of a secondary coil of the transformer;

a first rectifier device connected between another end of the secondary coil of the transformer and a first node;

a second rectifier device connected between the ground terminal and the first node; and a smoothing filter comprising an inductor device having an end connected to the first node.

And in the power amplifier of the eleventh developed mode, the pulse-modulated signal may be amplified by controlling conduction and nonconduction of a current from the DC power source by the switching element that uses the pulse-modulated signal, and the amplified signal, after being passed through the transformer and the rectifier device, may be smoothed by the inductor device to generate the current signal.

In the power amplifier of a twelfth developed mode, a load impedance of the first amplitude modulator may have the same value as a load impedance of the second amplitude modulator; and the first amplitude modulator and the second amplitude modulator may comprise a smoothing filter of a same configuration.

A wireless communication device of a thirteenth developed mode may comprise the abovementioned power amplifier.

A power amplification method of a fourteenth developed mode may be a power amplification method according to the abovementioned third aspect.

The power amplification method of a fifteenth developed mode may be a power amplification method according to the abovementioned fourth aspect.

The power amplification method of a sixteenth developed mode may further comprise delaying at least one of the amplitude-modulated component in the first amplifying, and the amplitude-modulated component in the second amplifying.

A description is given below of the method and device of the present invention, based on exemplary embodiments shown in the accompanying drawings. It is to be noted that identical or corresponding portions in the drawings are given the same reference symbols, and descriptions thereof are not repeated.

First Exemplary Embodiment

A description is given concerning a power amplifier according to a first exemplary embodiment, making reference to the drawings. FIG. 1 is a block diagram showing a configuration of the power amplifier according to the present exemplary embodiment. Referring to FIG. 1, the power amplifier comprises a polar modulator 52, a first amplitude modulator 41, a second amplitude modulator 11, and a first RF amplifier (RF-PA: Radio Frequency Power Amplifier) 6.

The polar modulator 52 receives a modulated signal including an amplitude-modulated component and a phase-modulated component and outputs the amplitude-modulated component, in addition to superimposing the modulated signal on a carrier wave to output a result as an RF-modulated signal, and delaying at least one of the amplitude-modulated component and the RF-modulated signal.

The first amplitude modulator 41 receives the amplitude-modulated component, pulse-modulates the amplitude-modulated component to output a result as a pulse-modulated signal, in addition to amplifying the amplitude-modulated component with the amplitude-modulated component and the pulse-modulated signal as control signals, to output a result.

The second amplitude modulator 11 receives the amplitude-modulated component and the pulse-modulated signal, and amplifies the amplitude-modulated component with the amplitude-modulated component and the pulse-modulated signal as control signals, to output a result.

The first RF amplifier 6 receives the RF-modulated signal, amplifies the RF-modulated signal, and then performs amplitude modulation by an output signal of the second amplitude modulator 11, to output a result.

The polar modulator 52 may receive a modulated signal including an amplitude-modulated component and a phase-modulated component, and output the amplitude-modulated component, and in addition may superimpose the phase-modulated component on a carrier wave to output a result as an RF phase-modulated signal and delay at least one of the amplitude-modulated component and the RF phase-modulated signal. In this case, the first RF amplifier 6 receives the RF phase-modulated signal, amplifies the RF phase-modulated signal, and then performs amplitude modulation by an output signal of the second amplitude modulator 11, and outputs a result.

Figure 2:
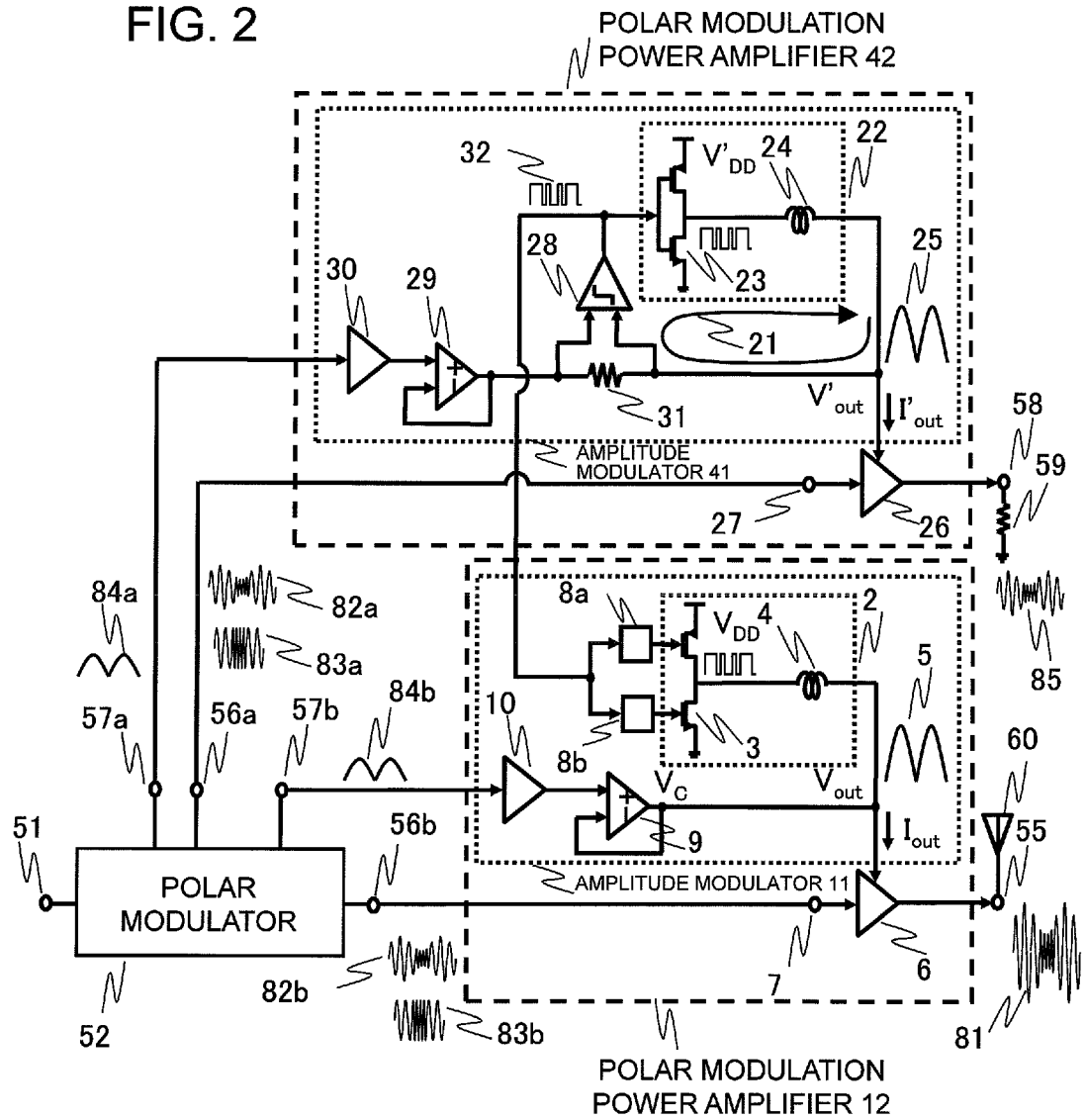
FIG. 2 is a diagram showing a configuration of a power amplifier according to the first exemplary embodiment.

FIG. 2 is a diagram showing in further detail a configuration of the power amplifier according to the present exemplary embodiment. Referring to FIG. 2, the power amplifier of the present exemplary embodiment comprises the polar modulator 52, a polar modulation power amplifier 12 for outputting an RF-modulated signal 81 actually used in communication, and a polar modulation power amplifier 42 for generating a pulse-modulated signal 32.

The polar modulator 52 outputs an amplitude-modulated component 84a of a transmission signal to an output terminal 57a, based on transmission signal data received by an input terminal 51, and outputs an amplitude-modulated component 84b of a transmission signal to an output terminal 57b. Furthermore, an RF-modulated signal 82a or an RF phase-modulated signal 83a is outputted to an output terminal 56a, and an RF-modulated signal 82b or an RF phase-modulated signal 83b is outputted to an output terminal 56b. The polar modulator 52 adjusts output timing (delay time) of the amplitude-modulated component 84a, the amplitude-modulated component 84b, the RF-modulated signal 82a or the RF phase-modulated signal 83a, and the RF-modulated signal 82b or the RF phase-modulated signal 83b. The output timing of the RF-modulated signal 82a or the RF phase-modulated signal 83a is preferably delayed from the output timing of the amplitude-modulated component 84a by the delay time of the first amplitude modulator 41. Furthermore, the output timing of the RF-modulated signal 82b or the RF phase-modulated signal 83b is preferably delayed from the output timing of the amplitude-modulated component 84b by the delay time of the first amplitude modulator 11.

The polar modulation power amplifier 12 amplifies the RF-modulated signal 82b or the RF phase-modulated signal 83b, and outputs a desired RF-modulated signal 81.

The polar modulation power amplifier 42 outputs the pulse-modulated signal 32 for controlling a switching amplifier 2 of the polar modulation power amplifier 12.

The polar modulation power amplifier 12 is provided with the amplitude modulator 11 and the RF-PA (first RF amplifier) 6. The amplitude modulator 11 controls supplied power to the RF-PA 6 in accordance with the amplitude of the RF-modulated signal 81. The amplitude modulator 11 has a voltage source including a linear amplifier 10 and a voltage follower linear amplifier 9, and has a current source including a high-side gate driver 8a, a low-side gate driver 8b, and the switching amplifier 2.

Similar to Patent Document 1, an output voltage 5 ($V_{out}$) of the amplitude modulator 11 substantially matches an output voltage $V_C$ of a linear amplifier 9 that operates as a voltage source with no output error. Therefore, it is possible to suppress error of the output voltage $V_{out}$. It is to be noted that in order that the linear amplifier 9 operates as a preferable voltage source with low output impedance, the linear amplifier 9, as an example, is preferably implemented by a voltage follower circuit, which is a feedback amplifier.

The switching amplifier 2 comprises an inverter circuit 3 and an inductor 4. In the switching amplifier 2, the inverter circuit 3 amplifies the pulse-modulated signal 32 received via the gate drivers 8a and 8b, and the pulse-modulated signal after amplification is smoothed by the inductor device 4. In this way, the switching amplifier 2 outputs a current signal $I_{out}$ obtained by amplifying the amplitude-modulated component 84a.

A major part of the current $I_{out}$ (and power) supplied to the voltage source terminal of the RF-PA 6 is supplied by the output current (and power) of the switching amplifier 2 that has high efficiency. Therefore, the power efficiency of the amplitude modulator 11 also has high efficiency. It is to be noted that the amplitude modulator 11 and the RF-PA 6 are designed to output a high power signal, and as an example, are preferably implemented by discrete parts.

The polar modulator 52 delays output timing of the amplitude-modulated component 84b by the delay time of the gate drivers 8a and 8b from the output timing of the amplitude-modulated component 84a. Furthermore, the polar modulator 52 delays output timing of the RF-modulated signal 82b or the RF phase-modulated signal 83b, from the output timing of the RF-modulated signal 82a or the RF phase-modulated signal 83a by the delay time of the gate drivers 8a and 8b.

In this way, an effect of the delay time of the gate drivers 8a and 8b is corrected, the RF-modulated signal 81 and the current $I_{out}$ and the voltage $V_{out}$ outputted from the amplitude modulator 11 are synchronized, and it is possible to curtail increased power consumption of the voltage source (linear amplifiers 9 and 10) due to mismatch of synchronization (delay), and to curtail signal error of the RF-modulated signal 81.

The polar modulation power amplifier 42 comprises the amplitude modulator 41 and the RF-PA (second RF amplifier) 26. The amplitude modulator 41 controls supplied power to the RF-PA 26 in accordance with the amplitude of RF-modulated signal 85 that is an output signal of the RF-PA 26. The outputted RF-modulated signal 85 is terminated by a load 59. The amplitude modulator 41 has a voltage source including a linear amplifier 30 and a voltage follower linear amplifier 29, and has a current source including a switching amplifier 22. The switching amplifier 22 includes an inverter circuit 23 and an inductor 24. The pulse-modulated signal 32 controlling the switching amplifiers 22 and 2 is outputted from a hysteresis comparator 28 based on a detection current $I_C$ in a sense resistor 31. That is, the hysteresis comparator 28 operates as a pulse modulator.

Output power of the switching amplifier 22 is designed to be low, to an extent such that the switching amplifier 22 can be directly driven by the hysteresis comparator 28, without using a gate driver. Therefore, the output power is designed, to be low also for the amplitude modulator 41 and the RF-PA 26. The RF-modulated signal 85 outputted from the polar modulation power amplifier 42 is preferably designed to be of low power to an extent such that it can be ignored with respect to the power of the RF-modulated signal 81 outputted from the polar modulation power amplifier 12. Furthermore, the amplitude modulator 41 and the RF-PA 26 are preferably integrated in an IC.

In the present exemplary embodiment, with the inductor 24 and the inductor 4 having the same inductance value, load impedance ($=V'_{out}/I'_{out}$) of the amplitude modulator 41 and load impedance ($=V_{out}/I_{out}$) of the amplitude modulator 11 preferably have the same value. The output voltage $V'_{out}$ of the amplitude modulator 41 is set by a source voltage $V'_{DD}$ of the switching amplifier 22, and the output voltage $V_{out}$ of the amplitude modulator 11 is set by a source voltage $V_{DD}$ of the switching amplifier 2. Furthermore, the output current $I'_{out}$ of the amplitude modulator 41 is set by the device size of the RF-PA 26, and the output current $I_{out}$ of the amplitude modulator 11 is set by the device size of the RF-PA 6.

By having these values, desired values of pulse-modulated signals that drive the switching amplifier 22 and the switching amplifier 2 match, and the switching amplifier 22 and the switching amplifier 2 can be controlled by the same pulse-modulated signal 32.

Since the amplitude modulator 41 of the polar modulation power amplifier 42 does not use a gate driver with a large delay time, bandwidth limitation of a current feedback loop 21, which is a problem in Patent Document 1, does not occur. Furthermore, since the amplitude modulator 11 of the polar modulation power amplifier 12 does not have a current feedback loop, the bandwidth limitation problem does not occur.

Figure 3:
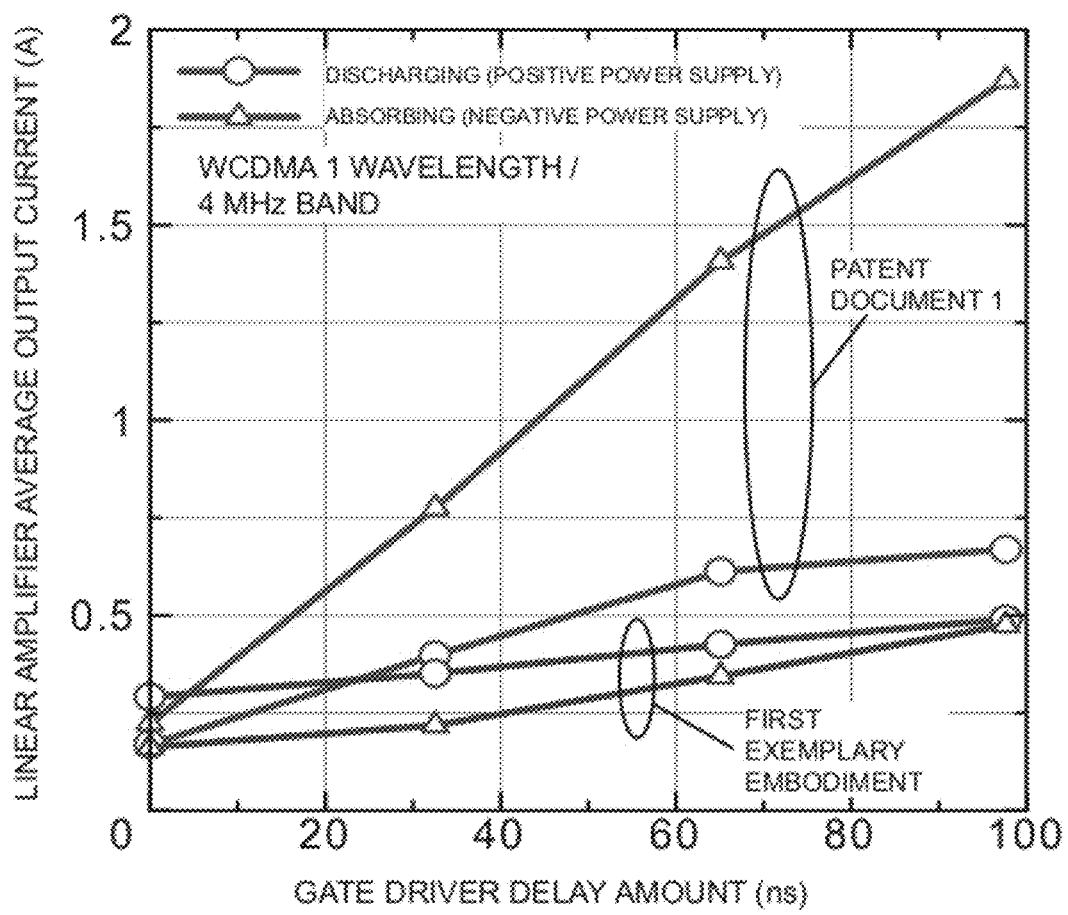
FIG. 3 is a diagram showing dependency of average output current of a linear amplifier with respect to gate driver delay time according to the first exemplary embodiment.
Figure 11:
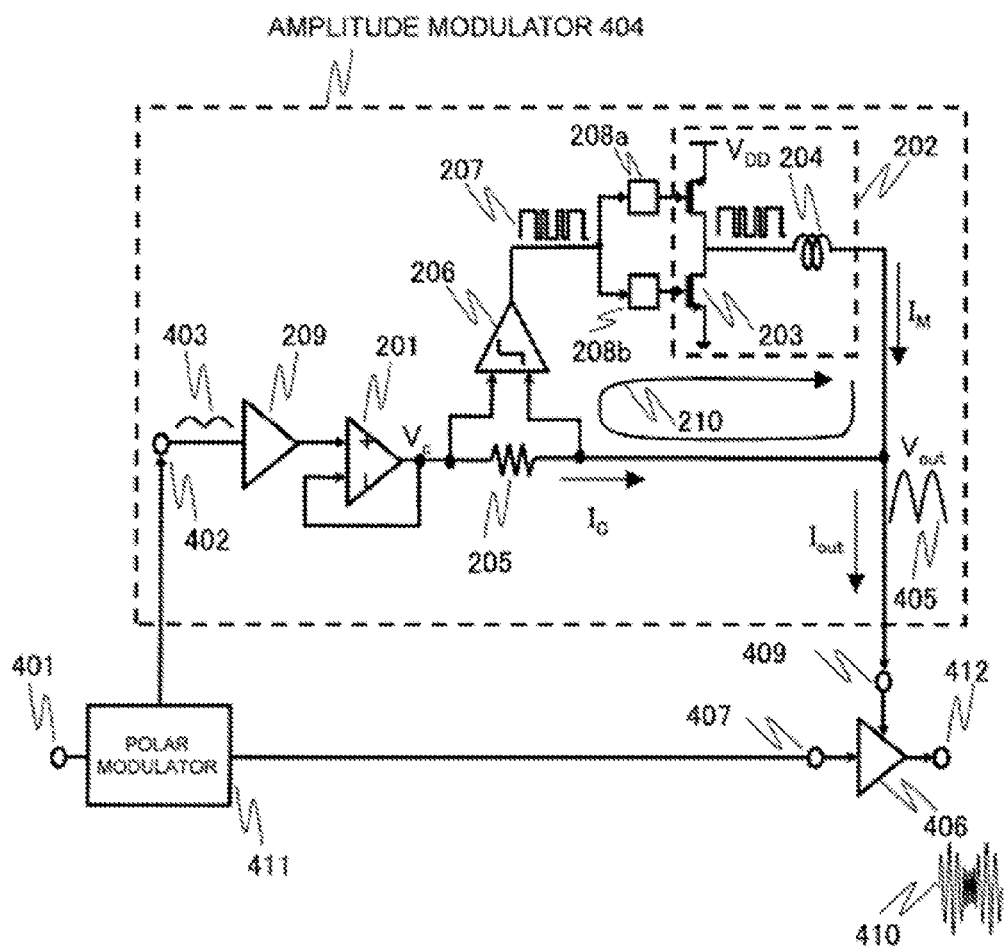
FIG. 11 is a configuration diagram of a power amplifier based on Patent Document 1.
Figure 12:
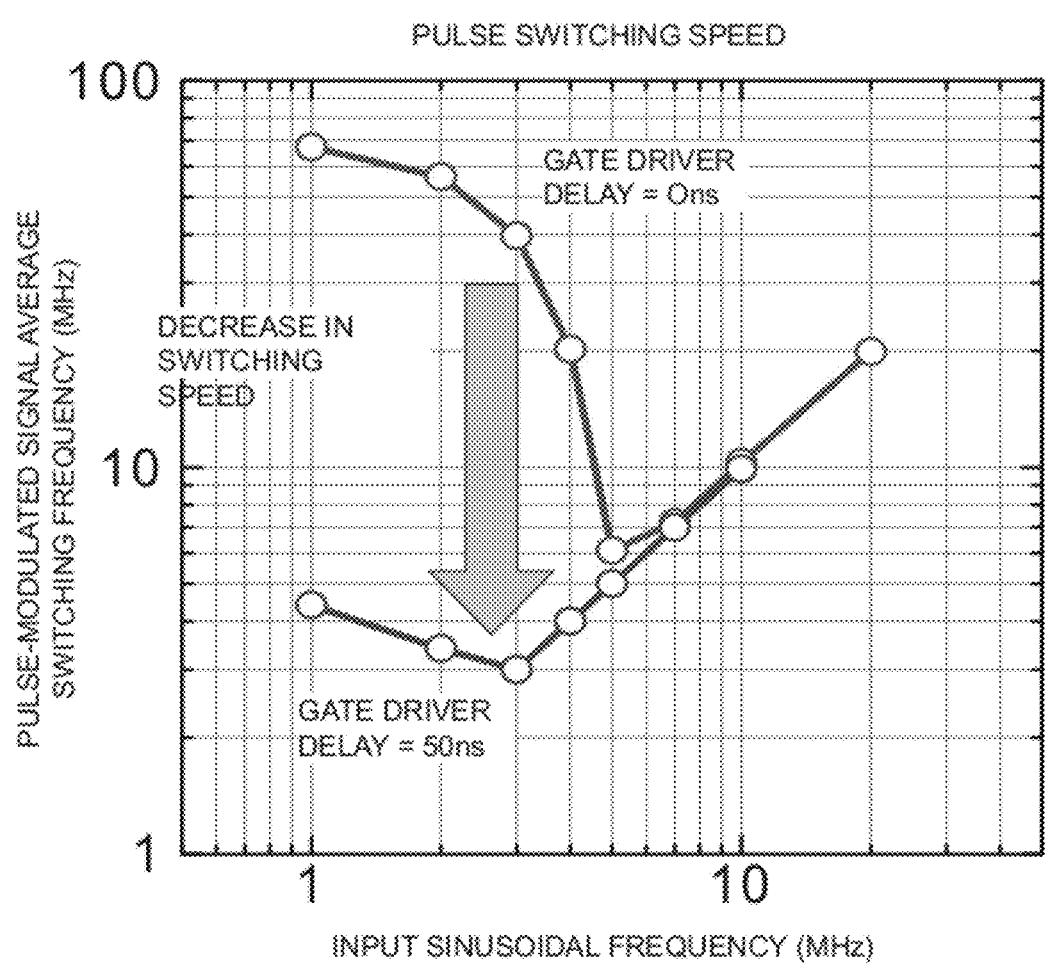
FIG. 12 is a diagram showing change in switching frequency of a switching amplifier with respect to gate driver delay time, in the configuration of Patent Document 1.
Figure 13:
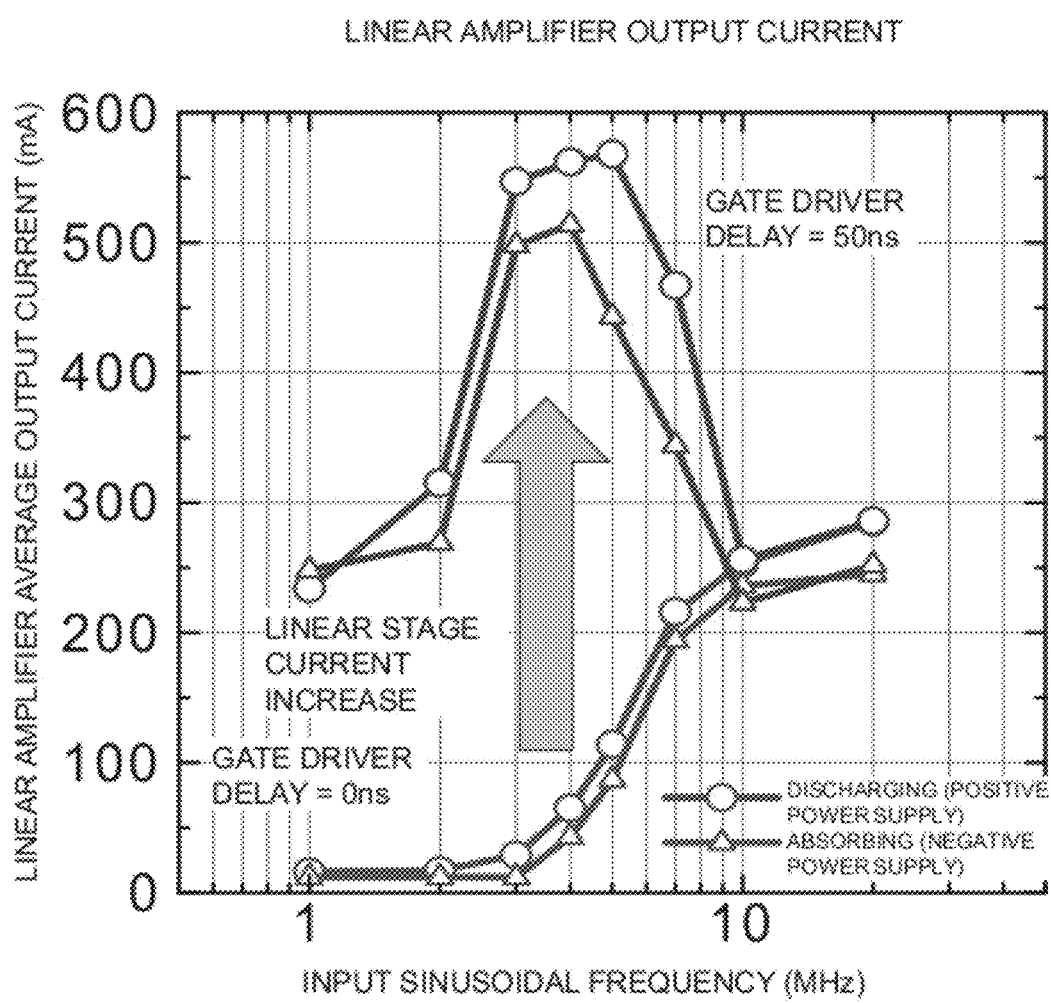
FIG. 13 is a diagram showing change in average output current of a linear amplifier with respect to gate driver delay time, in the configuration of Patent Document 1.

FIG. 3 shows the relationship of delay amount of the gate drivers 208a and 208b and output current of a linear amplifier 201, in Patent Document 1 (FIG. 11), and a result of simulating the relationship of the output current of the liner amplifier 9 and the gate drivers 8a and 8b in the present exemplary embodiment (FIG. 2). Referring to FIG. 3, in a configuration of Patent Document 1, the output current of the linear amplifier 201 increases considerably as the delay amount of the gate drivers 8a and 8b increases. On the other hand, according to present exemplary embodiment, in a case where the delay amount of the gate drivers 8a and 8b increases, the increase in the output current of the linear amplifier 9 is kept low. Therefore, according to a configuration of the present exemplary embodiment, compared to the configuration of Patent Document 1, power consumption of the linear amplifier 9 is curtailed, and power efficiency of the polar modulation power amplifier 12 is improved.

Figure 4:
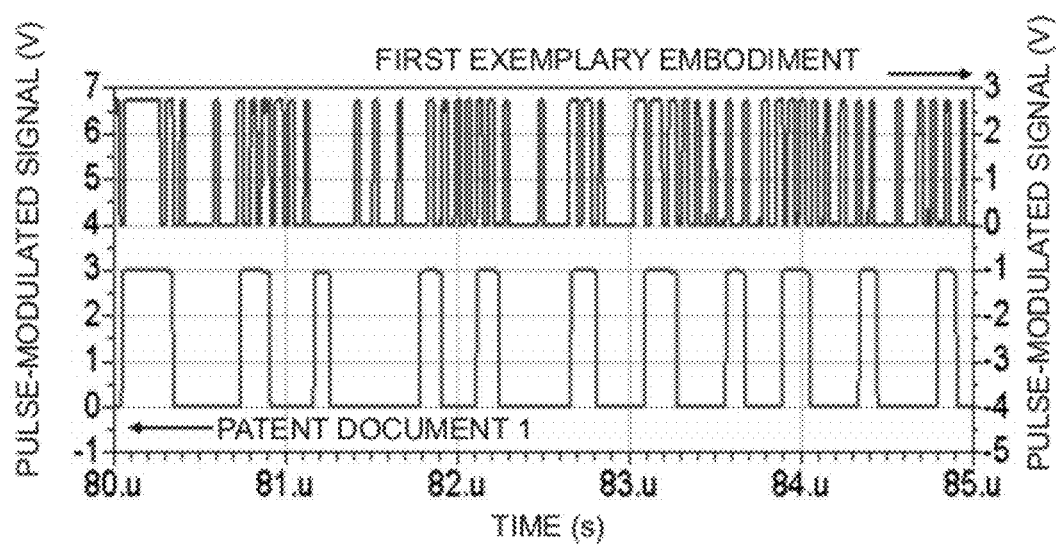
FIG. 4 is a diagram showing a time waveform of a switching voltage of a switching amplifier according to the first exemplary embodiment.
Figure 5:
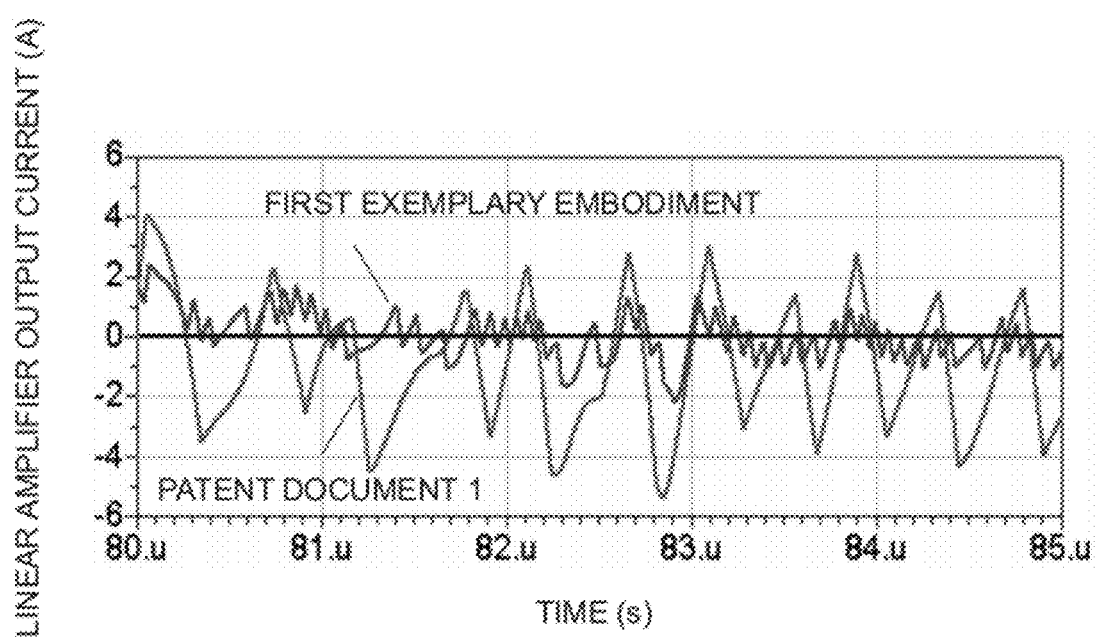
FIG. 5 is a diagram showing a time waveform of an output current of a linear amplifier according to the first exemplary embodiment.
Figure 6:
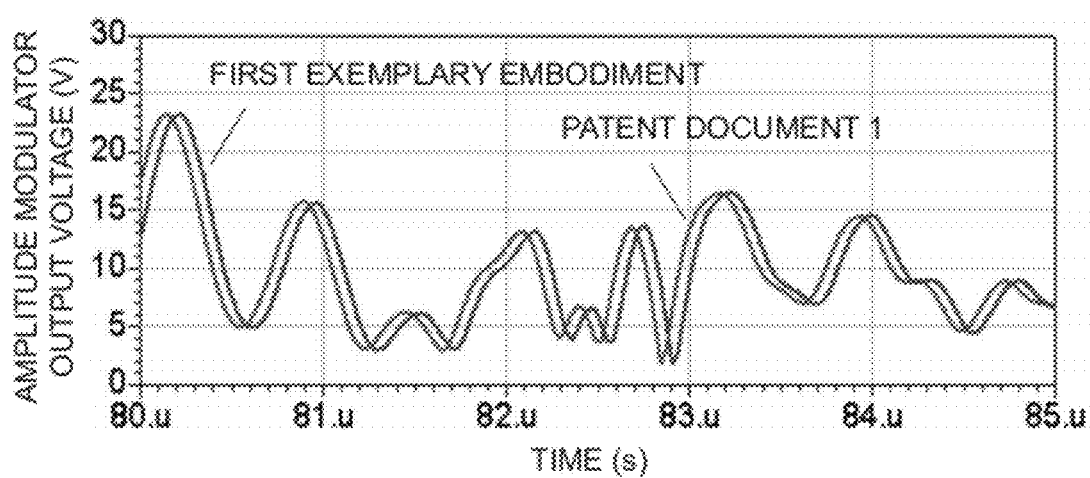
FIG. 6 is a diagram showing a time waveform of an output voltage of an amplitude modulator according to the first exemplary embodiment.

FIG. 4 to FIG. 6 show a result in which the delay amount of the gate drivers 208a and 208b in the configuration (FIG. 11) of Patent Document 1, and of the gate drivers 8a and 8b in the configuration (FIG. 2) of the present exemplary embodiment is set to 65 ns, and respective waveforms of circuits in Patent Document 1 and the present exemplary embodiment are simulated.

FIG. 4 is a diagram showing a time waveform of a switching voltage of a switching amplifier according to the present exemplary embodiment and a switching amplifier according to Patent Document 1. Referring to FIG. 4, in a case where there is a gate driver delay amount (65 ns), in the configuration of Patent Document 1 the switching frequency of a pulse-modulated signal 207 is reduced. On the other hand, in the configuration of the present exemplary embodiment, a decrease in the switching frequency of the pulse-modulated signal 32 is not seen.

FIG. 5 is a diagram showing a time waveform of an output current of a linear amplifier according to the present exemplary embodiment and a linear amplifier according to Patent Document 1. Referring to FIG. 5, in the configuration of Patent Document 1, the output current of the linear amplifier 201 increases. On the other hand, in the configuration of the present exemplary embodiment, the output current of the linear amplifier 9 is curtailed.

FIG. 6 is a diagram showing a time waveform of an output voltage of an amplitude modulator according to the present exemplary embodiment and of an amplitude modulator according to Patent Document 1. Referring to FIG. 6, the output voltage $V_{out}$ of the amplitude modulator 404 of the configuration of Patent Document 1 and the output voltage $V_{out}$ of the amplitude modulator 11 of the configuration of the present exemplary embodiment substantively match, and signal accuracy of a similar extent is realized.

Second Exemplary Embodiment

Figure 7:
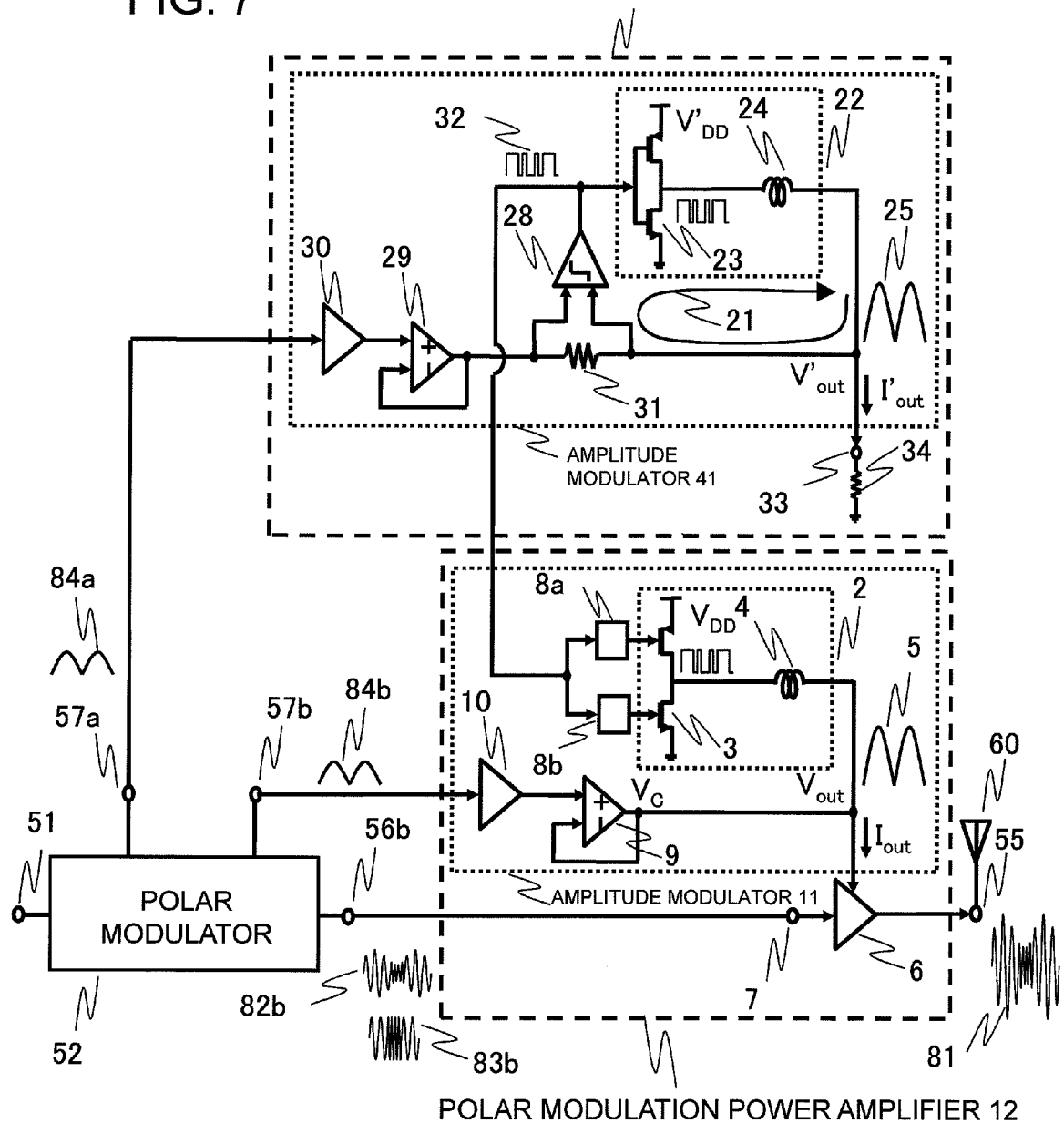
FIG. 7 is a diagram showing a configuration of a power amplifier according to a second exemplary embodiment.

A description is given concerning a power amplifier related to a second exemplary embodiment, making reference to the drawings. FIG. 7 is a diagram showing a configuration of the power amplifier according to the present exemplary embodiment. Referring to FIG. 7, with regard to the power amplifier of the present exemplary embodiment, an RF-PA (second RF amplifier) in the power amplifier of the first exemplary embodiment is replaced by a resistance element 34.

An impedance value $(=V'_{out}/I'_{out})$ of the resistance element 34 is preferably the same as a load impedance value $(=V_{out}/I_{out})$ of an amplitude modulator 11, and an inductor 24 and an inductor 4 preferably have the same inductance value. By having these values, desired values of pulse-modulated signals that drive a switching amplifier 22 and a switching amplifier 2 match, and the switching amplifier 22 and the switching amplifier 2 can be controlled by the same pulse-modulated signal 32.

In the present exemplary embodiment, with regard to a load of an amplitude modulator 41, by replacing the RF-PA 26 in the power amplifier according to the first exemplary embodiment by the resistance element 34, circuit configuration is simplified. In a case where an output load circuit of the amplitude modulator 41 is changed, as in the present exemplary embodiment, a behavior and effect similar to the first exemplary embodiment are obtained. That is, the present invention can be applied without depending on circuit type for output load of the amplitude modulator 41.

Third Exemplary Embodiment

Figure 8:
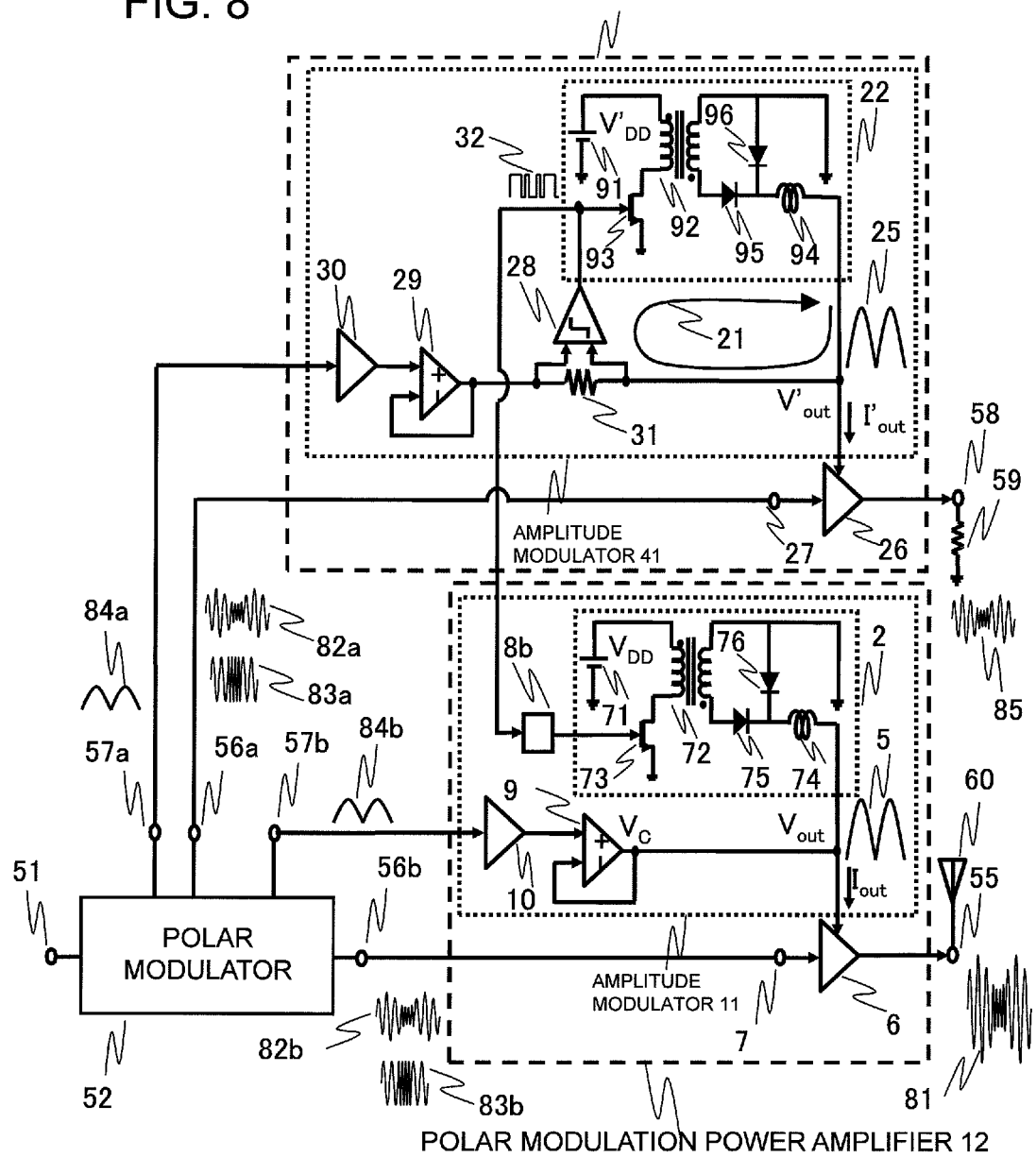
FIG. 8 is a diagram showing a configuration of a power amplifier according to a third exemplary embodiment.
Figure 9:
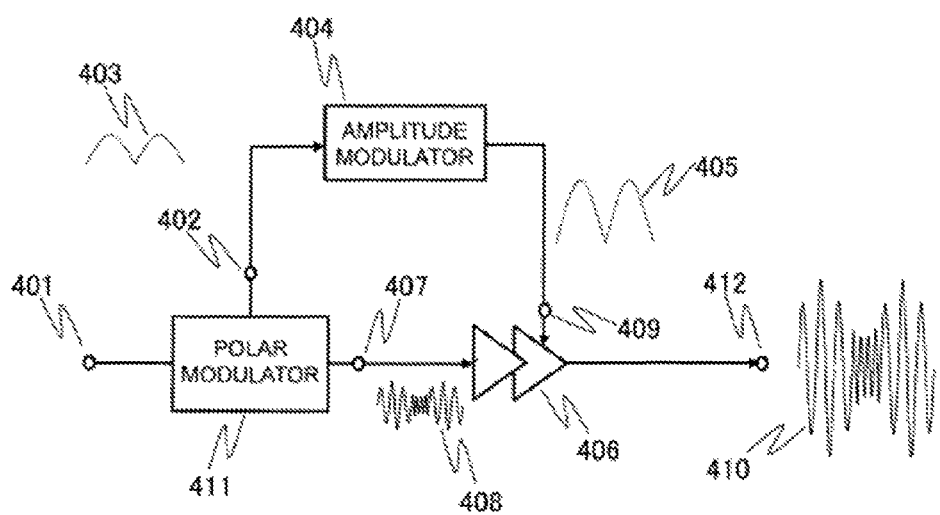
FIG. 9 is a diagram showing a configuration of a power amplifier in which ET technology is applied.
Figure 10:
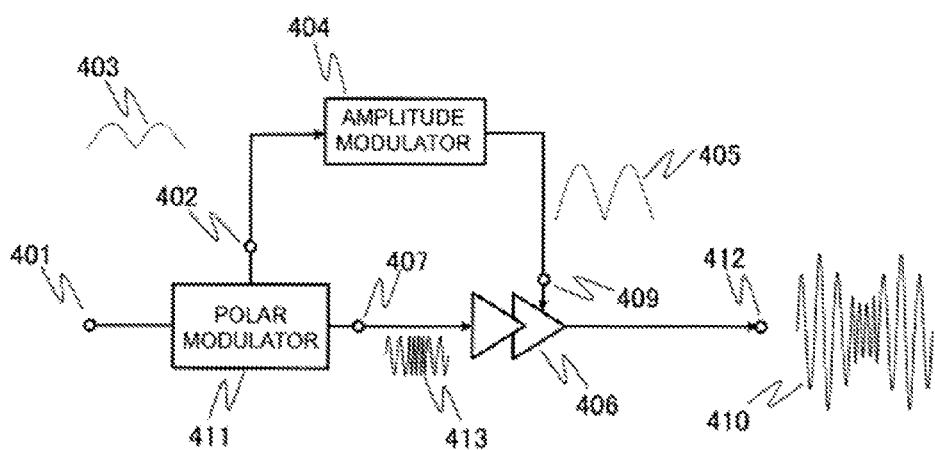
FIG. 10 is a diagram showing a configuration of a power amplifier in which EER technology is applied.

A description is given concerning a power amplifier according to a third exemplary embodiment, making reference to the drawings. FIG. 8 is a diagram showing a configuration of the power amplifier according to the present exemplary embodiment. Referring to FIG. 8, in the present exemplary embodiment, with respect to switching amplifiers 2 and 22 in the power amplifier of the first exemplary embodiment, an inverter circuit is replaced by a feed forward converter circuit.

The switching amplifier 2 includes a voltage source 71, a transformer 72, a switching element 73, an inductor 74, and diodes 75 and 76, and is driven by a low-side gate driver 8b. A pulse-modulated signal 32 is received by the switching amplifier 2 via the low-side gate driver 8b, and the pulse-modulated signal 32 is amplified and outputted to a cathode of the diodes 75 and 76. By the amplified pulse-modulated signal 32 being smoothed by the inductor device 74, the switching amplifier 2 outputs a current signal $I_{out}$ obtained by amplifying an amplitude-modulated component 84a.

The switching amplifier 22 includes a voltage source 91, a transformer 92, a switching element 93, an inductor 94, and diodes 95 and 96. With regard to the switching amplifier 22, by the amplified pulse-modulated signal 32 being outputted to a cathode of the diodes and 96, and the amplified pulse-modulated signal 32 being smoothed by the inductor device 94, a current signal $I'_{out}$ obtained by amplifying the amplitude-modulated component 84a is outputted.

In the present exemplary embodiment, with the inductor 94 and the inductor 74 having the same inductance value, load impedance $(=V'_{out}/I'out)$ of an amplitude modulator 41 and load impedance $(=Vout/Iout)$ of an amplitude modulator 11 preferably have the same value. Output voltage $V'_{out}$ of the amplitude modulator 41 is set by a source voltage $V'_{DD}$ of the switching amplifier 22, and output voltage $V_{out}$ of the amplitude modulator 11 is set by a source voltage $V_{DD}$ of the switching amplifier 2. Furthermore, output current $I'_{out}$ of the amplitude modulator 41 is set by the device size of the RF-PA 26, and output current $I_{out}$ of the amplitude modulator 11 is set by the device size of the RF-PA 6.

By having these values, desired values of pulse-modulated signals that drive the switching amplifier 22 and the switching amplifier 2 match, and the switching amplifier 22 and the switching amplifier 2 can be controlled by the same pulse-modulated signal 32.

Comparing with the first exemplary embodiment in which an inverter type of switching amplifier is applied, in the present exemplary embodiment a high-side gate driver 8a that requires high voltage operation and a switching element that is to be driven thereby are unnecessary. Therefore it is possible to reduce power consumption, and it is possible to suppress the risk that an element will be destroyed by high voltage operation.

Even in a case of changing the internal configuration of the switching amplifiers 2 and 22, as in the present exemplary embodiment, a behavior and effect similar to the first exemplary embodiment is obtained. That is, the present invention can be applied without depending on the internal configuration of the switching amplifiers 2 and 22.

The disclosure of the above Patent Document is incorporated herein by reference thereto. Modifications and adjustments of the exemplary embodiment are possible within the scope of the overall disclosure (including the claims) of the present invention and based on the basic technical concept of the present invention. Various combinations and selections of various disclosed elements (including each element of each claim, each element of each exemplary embodiment, each element of each drawing, etc.) are possible within the scope of the claims of the present invention. That is, the present invention of course includes various variations and modifications that could be made by those skilled in the art according to the overall disclosure including the claims and the technical concept.

The invention claimed is:

1. A power amplifier comprising:
a polar modulator that receives a modulated signal including an amplitude-modulated component and a phase-modulated component, outputs the amplitude-modulated component, superimposes the modulated signal on a carrier wave to generate a signal output as an RF-modulated signal, and delays at least one of the amplitude-modulated component and the RF-modulated signal;
a first amplitude modulator that receives the amplitude-modulated component, pulse-modulates the amplitude-modulated component to generate a signal output as a pulse-modulated signal, and amplifies the amplitude-modulated component with the amplitude-modulated component and the pulse-modulated signal as control signals;
a second amplitude modulator that receives the amplitude-modulated component and the pulse-modulated signal, and amplifies the amplitude-modulated component with the amplitude-modulated component and the pulse-modulated signal as control signals; and
a first RF amplifier that receives the RF-modulated signal, amplifies the RF-modulated signal, and amplitude-modulates the amplified RF-modulated signal with an output signal of the second amplitude modulator.

2. A power amplifier comprising:
a polar modulator that receives a modulated signal including an amplitude-modulated component and a phase-modulated component, outputs the amplitude-modulated component, superimposes the phase-modulated component on a carrier wave to generate a signal output as an RF phase-modulated signal, and delays at least one of the amplitude-modulated component and the RF phase-modulated signal;
a first amplitude modulator that receives the amplitude-modulated component, pulse-modulates the amplitude-modulated component to generate a signal output as a pulse-modulated signal, and amplifies the amplitude-modulated component with the amplitude-modulated component and the pulse-modulated signal as control signals;
a second amplitude modulator that receives the amplitude-modulated component and the pulse-modulated signal, and amplifies the amplitude-modulated component with the amplitude-modulated component and the pulse-modulated signal as control signals; and
a first RF amplifier that receives the RF phase-modulated signal, amplifies the RF-modulated signal, and amplitude-modulates the amplified RF-modulated signal with an output signal of the second amplitude modulator.

3. The power amplifier according to claim 1, wherein the polar modulator delays at least one of the amplitude-modulated component received by the first amplitude modulator and the amplitude-modulated component received by the second amplitude modulator.

4. The power amplifier according to claim 1, further comprising a second RF amplifier that receives and amplifies the RF-modulated signal or the RF phase-modulated signal, and amplitude-modulates the amplified signal with an output signal of the first amplitude modulator.

5. The power amplifier according to claim 1, further comprising a resistance element that terminates an output signal of the first amplitude modulator.

6. The power amplifier according to claim 1, wherein the first amplitude modulator comprises:
a terminal that receives the amplitude-modulated component;
a voltage source that outputs a voltage signal by amplifying the amplitude-modulated component;
a pulse modulator that pulse-modulates the amplitude-modulated component and outputs a result as a pulse-modulated signal;
a current source that amplifies the amplitude-modulated component with the pulse-modulated signal as a control signal to generate a signal output as a current signal;
a terminal that combines the voltage signal and the current signal and outputs the combined signal; and
a terminal that outputs the pulse-modulated signal.

7. The power amplifier according to claim 1, wherein the second amplitude modulator comprises:
a terminal that receives the amplitude-modulated component;
a voltage source that amplifies the amplitude-modulated component of the modulated signal and outputs a voltage signal;
a terminal that receives the pulse-modulated signal;
a current source that amplifies the amplitude-modulated component with the pulse-modulated signal as a control signal to generate a signal output as a current signal; and
a terminal that combines the voltage signal and the current signal and outputs the combined signal.

8. The power amplifier according to claim 6, wherein the voltage source comprises a feedback amplifier.

9. The power amplifier according to claim 6, wherein the current source is a switching amplifier that amplifies the pulse-modulated signal, and then generates the current signal by smoothing by a smoothing filter.

10. The power amplifier according to claim 9, wherein the switching amplifier comprises:
a first switching element;
a second switching element;
a ground terminal to which an end of the first switching element is connected;
a DC power source to which an end of the second switching element is connected; and
a smoothing filter comprising an inductor device having an end connected to a first node
to which another end of the first switching element and another end of the second switching element are connected; and wherein
using the pulse-modulated signal, conduction and nonconduction of a current from the ground terminal to the first node are controlled and also conduction and nonconduction of a current from the DC power source to the first node are controlled so as to amplify the pulse-modulated signal, and the amplified signal is smoothed by the inductor device to generate the current signal.

11. The power amplifier according to claim 9, wherein the switching amplifier comprises:
a transformer;
a DC power source connected to one end of a primary coil of the transformer;
a switching element connected to another end of the primary coil of the transformer; a ground terminal connected to one end of a secondary coil of the transformer;
a first rectifier device connected between another end of the secondary coil of the transformer and a first node;

a second rectifier device connected between the ground terminal and the first node; and a smoothing filter comprising an inductor device having an end connected to the first node; and wherein the pulse-modulated signal is amplified by controlling conduction and nonconduction of a current from the DC power source by the switching element that uses the pulse-modulated signal, and the amplified signal, after being passed through the transformer and the rectifier device, is smoothed by the inductor device to generate the current signal.

12. The power amplifier according to claim 9, wherein
a load impedance of the first amplitude modulator has the same value as a load impedance of the second amplitude modulator; and
the first amplitude modulator and the second amplitude modulator comprise a smoothing filter of a same configuration.

13. A wireless communication device comprising the power amplifier according to claim 1.

14. A power amplification method comprising:
extracting an amplitude-modulated component from a modulated signal including the amplitude-modulated component and a phase-modulated component, superimposing the modulated signal on a carrier wave to generate an RF-modulated signal, and delaying at least one of the amplitude-modulated component and the RF-modulated signal;
pulse-modulating the amplitude-modulated component by a first amplitude modulator to generate a pulse-modulated signal, and first amplifying the amplitude-modulated component with the amplitude-modulated component and the pulse-modulated signal as control signals;
receiving at a second amplitude modulator the pulse-modulated signal from the first amplitude modulator, and second amplifying the amplitude-modulated component with the amplitude-modulated component and the pulse-modulated signal as control signals to generate an amplified amplitude-modulated component; and
third amplifying the RF-modulated signal and amplitude-modulating the amplified RF-modulated signal with the amplified amplitude-modulated component.

15. A power amplification method comprising:
extracting an amplitude-modulated component from a modulated signal including the amplitude-modulated component and a phase-modulated component, superimposing the phase-modulated component on a carrier wave to generate an RF phase-modulated signal, and delaying at least one of the amplitude-modulated component and the RF phase-modulated signal;
pulse-modulating the amplitude-modulated component by a first amplitude modulator, to have a pulse-modulated signal, and first amplifying the amplitude-modulated component with the amplitude-modulated component and the pulse-modulated signal as control signals;
receiving at a second amplitude modulator the pulse modulated signal from the first amplitude modulator and second amplifying the amplitude-modulated component with the amplitude-modulated component and the pulse-modulated signal as control signals to generate an amplified amplitude-modulated component; and
third amplifying the RF phase-modulated signal and amplitude-modulating the amplified RF phase-modulated signal with the amplified amplitude-modulated component.

16. The power amplification method according to claim 14, further comprising delaying at least one of the amplitude-modulated component in the first amplifying, and the amplitude-modulated component in the second amplifying.

17. The power amplifier according to claim 2, wherein the polar modulator delays at least one of the amplitude-modulated component received by the first amplitude modulator and the amplitude-modulated component received by the second amplitude modulator.

18. The power amplification method according to claim 15, further comprising delaying at least one of the amplitude-modulated component in the first amplifying, and the amplitude-modulated component in the second amplifying.

* * * * *

UNITED STATES PATENT AND TRADEMARK OFFICE
CERTIFICATE OF CORRECTION

PATENT NO.        : 8,797,113 B2
APPLICATION NO.   : 13/499205
DATED             : August 5, 2014
INVENTOR(S)       : Shingo Yamanouchi It is certified that error appears in the above-identified patent and that said Letters Patent is hereby corrected as shown below:

In the Specification

Column 12, Line 21: Before "and" insert -- 95 --

Column 12, Line 27: Delete "I'out)" and insert -- I'$_{out}$) --

Column 12, Line 28: Delete "Vout/Iout)" and insert -- V$_{out}$/I$_{out}$) --

Signed and Sealed this
Third Day of February, 2015

Michelle K. Lee
*Deputy Director of the United States Patent and Trademark Office*